(12) United States Patent
Compeau

(10) Patent No.: US 10,646,074 B2
(45) Date of Patent: May 12, 2020

(54) REMOVABLE HANDLE COMPRISING A THERMOELECTRIC GENERATOR

(71) Applicant: SEB S.A., Ecully (FR)

(72) Inventor: Jean-Louis Compeau, Saint Quentin Fallavier (FR)

(73) Assignee: SEB S.A. (FR)

( * ) Notice: Subject to any disclaimer, the term of this patent is extended or adjusted under 35 U.S.C. 154(b) by 0 days.

(21) Appl. No.: 15/515,358

(22) PCT Filed: Sep. 28, 2015

(86) PCT No.: PCT/FR2015/052576
§ 371 (c)(1),
(2) Date: Mar. 29, 2017

(87) PCT Pub. No.: WO2016/051057
PCT Pub. Date: Apr. 7, 2016

(65) Prior Publication Data
US 2017/0224175 A1 Aug. 10, 2017

(30) Foreign Application Priority Data

Sep. 30, 2014 (FR) ...................................... 14 59229

(51) Int. Cl.
*H01L 35/30* (2006.01)
*A47J 45/07* (2006.01)
*A47J 36/06* (2006.01)
*A47J 37/10* (2006.01)

(52) U.S. Cl.
CPC .............. *A47J 45/071* (2013.01); *A47J 36/06* (2013.01); *A47J 37/101* (2013.01); *A47J 45/074* (2013.01); *H01L 35/30* (2013.01); *A47J 2202/00* (2013.01)

(58) Field of Classification Search
CPC .......................... H01L 35/00–34; H01L 27/16
USPC ................................................... 136/200–242
See application file for complete search history.

(56) References Cited

U.S. PATENT DOCUMENTS

| 5,620,255 A | 4/1997 | Cook, III |
| 6,279,568 B1 | 8/2001 | Anthony |
| 6,570,362 B1 * | 5/2003 | Estes ....................... H01L 23/38 |
| | | 136/205 |
| 2002/0127113 A1 * | 9/2002 | Kwon ................... F04D 29/384 |
| | | 417/2 |
| 2007/0228056 A1 | 10/2007 | Hoff |
| 2008/0008858 A1 * | 1/2008 | Hong ....................... E04D 5/12 |
| | | 428/143 |

(Continued)

FOREIGN PATENT DOCUMENTS

| CN | 201015533 Y | 2/2008 |
| EP | 2361538 A1 | 8/2011 |

(Continued)

*Primary Examiner* — Bach T Dinh
(74) *Attorney, Agent, or Firm* — Lerner, David, Littenberg, Krumholz & Mentlik, LLP

(57) ABSTRACT

The invention relates to a handle for a cooking vessel or lid that includes at least one thermoelectric generator. The invention is characterized in that the handle has a releasable locking device and the thermoelectric generator has at least one first contact surface thermally connected to a thermal coupling part that comes into contact under stress with a portion of the cooking vessel or lid when the releasable locking device of the handle is in a locked position on the cooking vessel or lid.

13 Claims, 2 Drawing Sheets

(56) References Cited

U.S. PATENT DOCUMENTS

| | | | |
|---|---|---|---|
| 2008/0290104 A1 | 11/2008 | Ng | |
| 2008/0290745 A1* | 11/2008 | Riedl | B25F 5/008 |
| | | | 310/50 |
| 2011/0268153 A1* | 11/2011 | He | A47J 37/108 |
| | | | 374/179 |
| 2011/0284565 A1* | 11/2011 | Corbin | A47J 45/10 |
| | | | 220/759 |
| 2013/0098417 A1* | 4/2013 | Gavillet | H01L 23/4275 |
| | | | 136/200 |
| 2013/0161343 A1* | 6/2013 | Ferron | A47J 45/068 |
| | | | 220/756 |
| 2014/0158334 A1 | 6/2014 | Dellea et al. | |
| 2014/0158701 A1* | 6/2014 | Bonnel | A47J 45/071 |
| | | | 220/759 |
| 2016/0131357 A1* | 5/2016 | Chen | F21S 8/086 |
| | | | 362/373 |

FOREIGN PATENT DOCUMENTS

| | | |
|---|---|---|
| EP | 2606791 A1 | 6/2013 |
| FR | 2977121 A1 | 12/2012 |
| WO | 2004008923 A2 | 1/2004 |
| WO | 2009147688 A1 | 12/2009 |
| WO | 2013007932 A1 | 1/2013 |
| WO | WO2013/007927 * | 1/2013 |
| WO | 2013130365 A1 | 9/2013 |

* cited by examiner

REMOVABLE HANDLE COMPRISING A THERMOELECTRIC GENERATOR

CROSS-REFERENCE TO RELATED APPLICATIONS

This application is the United States national phase of International Application No. PCT/FR2015/052576 filed Sep. 28, 2015, and claims priority to French Patent Application No. 1459229 filed Sep. 30, 2014, the disclosures of which are hereby incorporated in their entirety by reference.

BACKGROUND OF THE INVENTION

Field of the Invention

The invention pertains to the field of removable handles for cooking vessels (also referred to as vessels) or for lids of cooking vessels, referred to simply as lids. The invention pertains more specifically to removable handles with built-in power supply devices for the purpose of powering electronic functions that operate on the principle of thermoelectric conversion.

DESCRIPTION OF RELATED ART

There already exist cooking vessels, such as frying pans, that use a power supply device, such as a thermoelectric generator, to power an electronic temperature indication system situated in the handle. When the frying pans are heated, a heat flow is created. The thermoelectric generator uses this heat flow to produce the electricity necessary for the electronic indication system to function.

Removable handles also exist, and are used, for example, on cooking vessels or lids. One of the advantages offered by removable handles lies in the ease of storing cooking vessels or lids when the removable handle is removed from said vessels or lids. Another advantage lies in the fact that only one handle is needed for multiple cooking vessels or multiple lids.

Patent document CN201015533 describes a frying pan that comprises a pan body and a handle. The handle is screwed onto the pan body and is fixed with respect to said body, which means that a user can remove it from the pan body only by performing an unscrewing step, or he may not be able to remove it at all. The frying pan also comprises a temperature sensor, and this temperature can be viewed on a display built into the handle. To power this sensor and display, the frying pan comprises a thermoelectric generator, which supplies the electricity necessary for the sensor and display to function. To produce electricity, this thermoelectric generator comprises two surfaces, the first of which is positioned against the pan body. This positioning makes it possible to establish a heat exchange between the thermoelectric generator and the body of the pan. This document also describes a heat sink connected to the second surface of the thermoelectric generator. The heat sink is designed to promote the cooling of the thermoelectric generator, and it is in the shape of a metal radiator comprising fins that stand vertically.

One of the problems encountered with handles such as those described in the preceding document is that, by construction, they are connected to only one cooking vessel or to only one lid, which does not make it easier to store the cooking vessels or lids. Another problem encountered is that after a period of gripping the handle many times, there may come to be some mechanical play between the thermoelectric generator and the cooking vessel or lid, resulting in a diminished heat exchange between these two components. In this case, a loss of output of the thermoelectric generator is observed.

SUMMARY OF THE INVENTION

One solution proposed by this invention is to provide a handle that can be removed from the cooking vessel or lid, while being able to supply electricity, in a reliable manner, consistently over time, for additional electronic functions. To do this, one of the difficulties to be overcome consists of having an efficient heat exchange between the thermoelectric generator and the cooking vessel or the lid, when the handle is locked and/or removed over the course of repeated use. As a result, there will be only one removable handle that can have electronic functions powered in a self-sufficient, reliable way.

This objective is attained using a handle for a cooking vessel or lid that comprises at least one thermoelectric generator, characterized in that the handle comprises a releasable locking device, and the thermoelectric generator comprises at least one first contact surface thermally connected to a thermal coupler that is placed under pressure against a section of the cooking vessel or lid when the releasable locking device of the handle is in a locked position on the cooking vessel or lid.

According to one characteristic of the invention, the thermoelectric generator comprises a second contact surface connected thermally to a connection part.

According to one characteristic of the invention, the handle comprises a heat sink connected thermally to the connection part or to the second contact surface of the thermoelectric generator.

According to a first embodiment, the heat sink consists of one or more fins that are shorter in length than the handle.

According to one characteristic of the invention, the fins are made of a heat conductive material.

According to one variation, the fins are heat pipes.

According to a second embodiment of the handle, the heat sink consists of a radiator comprising at least two fins assembled vertically and parallel to one another, to obtain convection cooling.

According to a third embodiment of the handle, the heat sink is a latent heat sink consisting of a solid body comprising a melting point of between 50° C. and 70° C.

According to one embodiment characteristic of the handle, said handle comprises a heat diffuser.

According to one characteristic of the invention, the handle comprises an electronic device connected to the thermoelectric generator.

According to one characteristic of the invention, the electronic device may be an electronic display or an electronic sensor.

According to one characteristic of the invention, the handle comprises crosswise through-holes and/or longitudinal through-holes for ventilation.

According to one characteristic of the invention, the handle comprises a micro-fan connected to the thermoelectric generator.

The invention also pertains to a power generating device for the handle of a cooking vessel or lid, the power generating device comprises a thermoelectric generator, and the power generating device comprises a thermal coupler connected thermally to the thermoelectric generator, and a heat sink connected thermally to the thermoelectric generator, and the power generating device is removable from the handle.

BRIEF DESCRIPTION OF THE DRAWINGS

The objectives, aspects and advantages of this invention will be better understood through the description provided below of specific embodiments of the invention, which are presented as non-limiting examples, in reference to the attached drawings, in which.

DETAILED DESCRIPTION OF THE INVENTION

Figure 1:
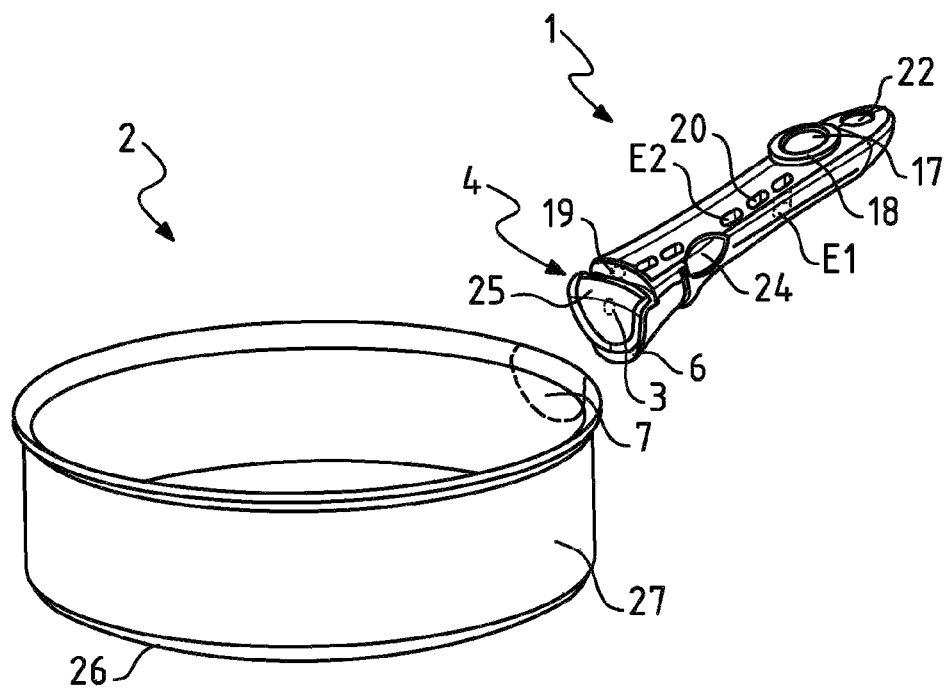
FIG. 1 is a perspective view of a cooking vessel and a handle in a first embodiment.

The handle (1) for a cooking vessel (2) (referred to hereafter simply as a vessel (2)) or for lids of cooking vessels (referred to simply as lids), as depicted in FIG. 1, comprises a releasable locking device (4). This releasable locking device (4) comprises one or more activation buttons (24) designed to initiate the movement of at least one tightening part (25). This tightening part (25) is used to attach the handle (1) to a vessel (2) or a lid.

In the case of a vessel (2), it comprises a bottom (26), a wall (27) surrounding the bottom (26) and a handle (1) that is attached to the wall (27). This vessel (2) may be, for example, a frying pan, but may also be a saucepan, stockpot or any other metal container designed to be thermally heated from the bottom (26). The vessel (2) may be made of aluminum or any other heat-conductive metal.

When a user wishes to lock the handle (1) onto the vessel (2), the tightening part (25) squeezes a section (7) of the wall (27) of the vessel (2) in the upper part of that wall (27).

In another embodiment of the releasable locking device (4), the vessel (2) comprises a lid (not depicted) and the locking piece (25) squeezes a section of the lid.

When the vessel (2) is heated, this section (7) will warm up. The same is true for the section of the lid that is squeezed by the locking piece (25).

Figure 2:
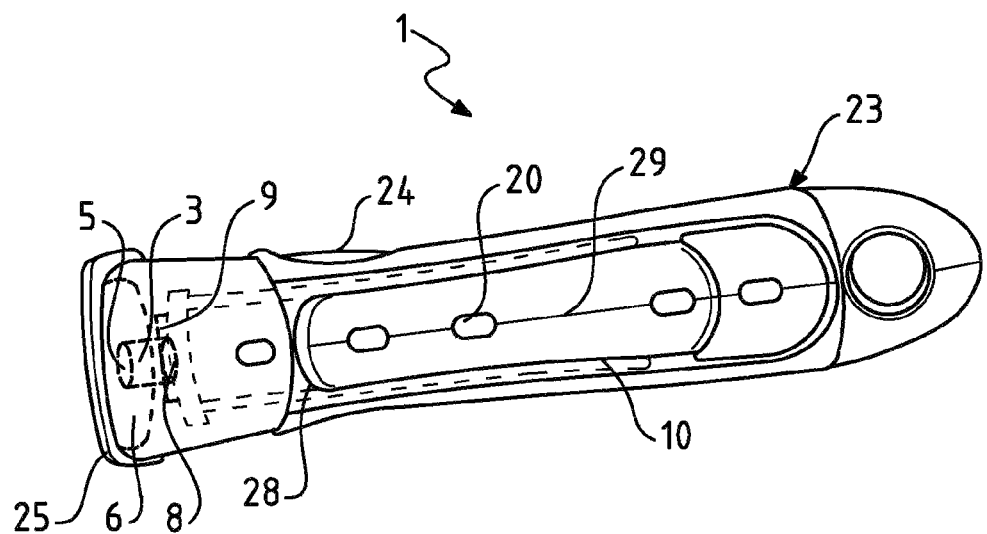
FIG. 2 is a perspective view of the handle as depicted in the first embodiment.

As shown in FIG. 2, the handle (1) comprises a main body (23). In a non-limiting manner, said body is made of a heat-stable material. This main body (23) can also be made of any other material that is not heat-conductive.

The main body (23) is hollow in the center and along the length of the handle (1) in order to obtain a cavity (28). In this manner, the cavity (28) may contain different components necessary for the invention to function, such as a thermoelectric generator (3), a heat sink (10) and a mechanism (29) related to the releasable locking device (4).

The thermoelectric generator (3) contained in the cavity (28) comprises at least one thermoelectric module, which may be a Peltier module. In this case, it has two contact surfaces (5, 8). A first contact surface (5), referred to as "hot," is placed in contact with a heat source, while the second contact surface (8), referred to as "cold," is placed in contact with a cold source.

Figure 3:
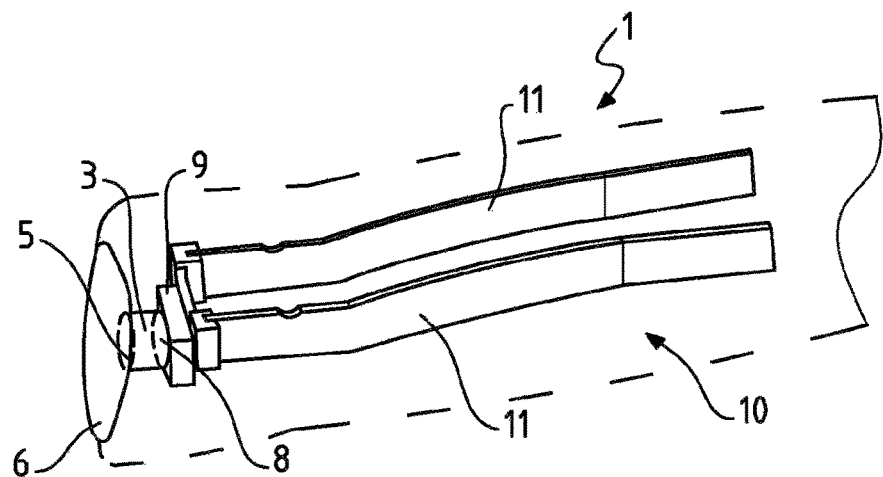
FIG. 3 is a perspective view of a portion of the handle as depicted in the first embodiment.

As shown in FIG. 3, the handle (1) may also comprise a connection part (9). The second (8) contact surface of the thermoelectric generator (3) is then connected thermally to this connection part (9).

The term "thermally connected" means that the contact between the second (8) contact surface and the connection part (9) has minimal thermal resistance.

However, the connection part (9) is not indispensable and in another variation, the handle (1) does not comprise a connection part (9), as will be described below.

As shown in FIGS. 1 and 3, the handle (1) also comprises a thermal coupling part (6), referred to as the coupler (6). This coupler (6) is thermally connected to the first (5) contact surface of the thermoelectric generator (3). This coupler (6) is provided to come into contact with the section (7) of the vessel (2) when the handle (1) is in a locked position, or in other words, when the tightening part (25) attaches the handle (1) to the vessel (2) or the lid. This coupler (6) is situated roughly opposite the tightening part (25) and on the other side of the section (7) with respect to the tightening part (25) when the handle is positioned on the vessel (2) or the lid. The function and usefulness of this coupler (6) are described in detail below. Once the handle (1) is locked on the wall (27), the coupler (6) is then in contact under pressure with the section (7) of the wall (27).

Preferably, this coupler (6) is metal and is made of either aluminum or copper.

The handle (1) also comprises a heat sink (10), as shown in FIG. 3. In the first embodiment of the handle (1), shown in FIG. 3, this heat sink (10) is contained in the cavity (28) of the handle (1) and does not interfere with the mechanism (29) related to the releasable locking device (4) also contained in the cavity (28) of the handle (1). The heat sink (10) is thermally connected to the connection part (9).

In one embodiment variation, there is no connection part (9), and the heat sink (10) is connected directly to the second (8) contact surface of the thermoelectric generator (3).

Still in reference to the first embodiment of the handle, the heat sink (10) is comprised of two fins (11) contained in the cavity (28) of the handle (1). They are oriented along the length of the handle (1) in the longitudinal direction.

These fins (11) are parallel and are shorter in length than the handle (1), and their dimensions are a function of the size of the handle (1) and the desired cooling.

The material of which the fins (11) are comprised is metal and heat-conductive. Preferably, this material may be aluminum or even copper.

In one variation, this material may be a heat pipe.

Figure 4:
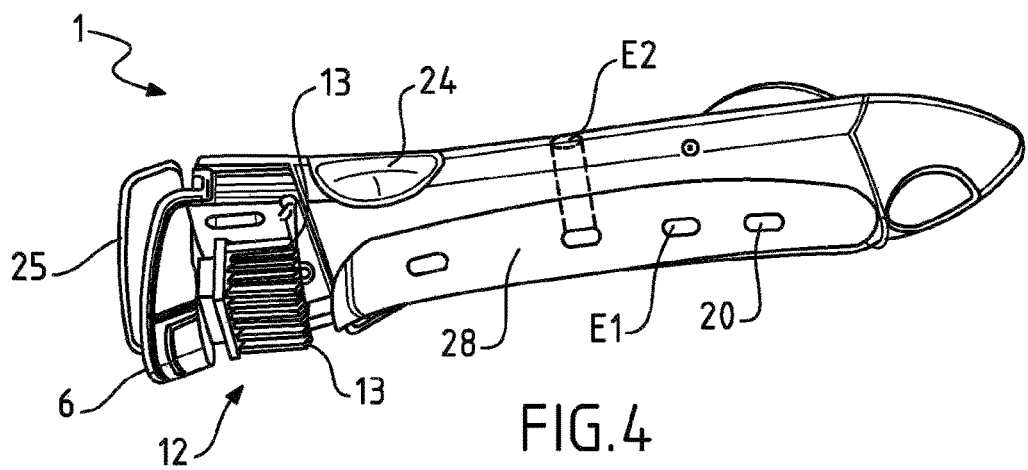
FIG. 4 is a perspective view of a handle in a second embodiment.

In a second embodiment of the handle (1), the heat sink (10), shown in FIG. 4, is a radiator (12). This radiator (12) comprises at least two fins (13) assembled vertically to obtain convection cooling, and the fins (13) are parallel to one another.

Figure 5:
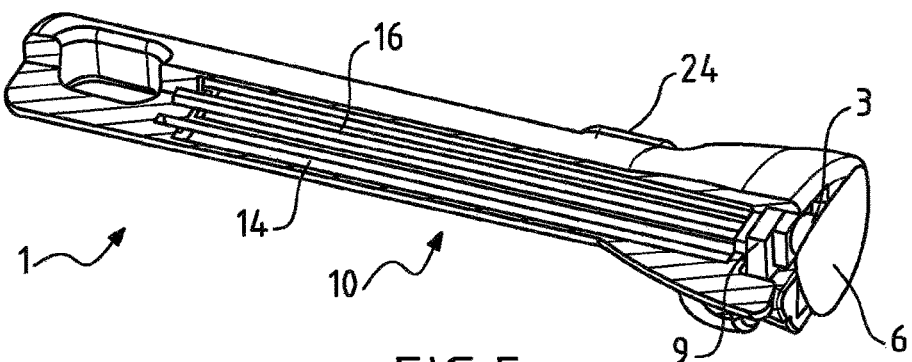
FIG. 5 is a perspective view of a handle in a third embodiment.

In a third embodiment of the handle (1), the heat sink (10), shown in FIG. 5, is a latent heat sink. The term "latent heat sink" means that the heat sink is made of a material that changes phase when it reaches a certain temperature.

According to the third embodiment of the handle (1), it is comprised of a solid body (14). This solid body (14) comprises a melting point of between 50° C. and 70° C. This solid body (14) is a paraffin-based mixture.

In this third embodiment, the handle (1) may also comprise a heat diffuser (16). The latter may be connected thermally to the connection part (9) or directly to the second (8) contact surface of the thermoelectric generator (3).

The heat diffuser (16) extends longitudinally in the handle (1), and more specifically in the solid body (14).

In the three embodiments of the handle (1) described above, said handle may also comprise an electronic device (17) connected to the thermoelectric generator (3). This electronic device (17) may be an electronic display (18) or an electronic sensor (19).

This electronic sensor (19) may be, as one non-limiting example, a temperature sensor.

In order to improve heat dissipation away from the handle (1) in the first and second embodiments described above, crosswise through-holes (20) for ventilation can be added to said handle, as shown in FIG. 1.

The number of these crosswise through-holes (20), as well as their diameter, is adjusted in proportion to the surface or the volume of the heat sink (10).

In the first embodiment of the heat sink (10), in which said heat sink is comprised of two fins (11), the crosswise through-holes (20) have intake holes (E1) through which air is drawn in, and output holes (E2), through which air is expelled. Total surface area S2 represents the combined surface area of all the output holes (E2) through which air is expelled, and total surface area S1 represents the combined surface area of all the intake holes (E1) through which the air is drawn in. In order to determine the number and size of these holes for optimal output of the thermoelectric generator (3), total surface area S2 must be equal to three times length L, which represents the total length of the fins. In a further effort to maximize output, total surface area S1 must be greater than total surface area S2.

The same reasoning, regarding the size of the crosswise through-holes (20), applies to the second embodiment of the handle (1).

Another solution, or to supplement these crosswise through-holes (20), longitudinal through-holes for ventilation (not depicted) may also be added. In the same way as the crosswise holes (20), the number and the diameter of these longitudinal holes is adjusted according to the surface area or volume of the heat sink (10).

In its first and second embodiment, the handle (1) may also comprise a micro-fan (22) connected to the thermoelectric generator (3) in order to be supplied with electricity.

For cases in which the handle (1) functions as described in the first and second embodiments of the handle (1), the invention consists, first, of establishing an efficient, repeatable thermal coupling between the thermoelectric generator (3) and the wall (27) of the vessel (2) or lid. This is obtained with the aluminum coupler (6), which maximizes the contact surface with the wall (27) of the vessel (2) or the lid, and when the handle (1) is locked onto the vessel (2) or the lid by the locking device (4), this coupler (6) is placed under high pressure on the section (7) of the wall (27) of the vessel (2) or lid.

While the vessel (2) is being heated, the aluminum wall (27) of said vessel will gradually warm up.

In cases in which the handle (1) is as described in the first embodiment, which is to say when the heat sink (10) consists of two metal fins (11), a heat flow will then be established between the wall (27) and the fins (11). As said fins warm up, in turn, a natural convection of the surrounding air will occur inside the handle (1) in the crosswise through-holes (20). As previously stated, these crosswise through-holes (20) make it possible to improve the convection process inside the handle (1). This convection may be accelerated through longitudinal through-holes for ventilation, placed in the longitudinal direction of the handle (1).

The crosswise through-holes (20) and the longitudinal through-holes may be present concurrently or only one or the other of these kinds of holes may be present.

This convection in these holes may also be accelerated by the use of the micro-fan (22) positioned on the handle (1).

The purpose of this convection is to allow the handle (1), and more specifically the fins (11), to dissipate heat to the surrounding air, thereby establishing a continuous system between the wall (27) of the vessel (2) or the lid and the surrounding air.

The heat flux that will be established as a continuous system will thus pass through the thermoelectric module by way of the coupler (6) and create, at its terminals, electrical voltage that will be proportionate to the heat flux.

Thus, if the heat flux is zero, the electric voltage will be zero, which occurs when the fins (11) are not dissipating enough heat.

When the vessel (2) is placed on a cooktop emitting 300 W of power, the flux obtained in a continuous system through the thermoelectric module goes from 3 W/cm$^2$ to 6 W/cm$^2$, which corresponds to electricity production ranging from 7.2 mW to 14 mW at a voltage ranging from 1.5 V to 2.7 V.

Preferably, the average flux obtained in a continuous system through the thermoelectric module is approximately 3 W/cm$^2$, which results in electricity production of 7.2 mW at a voltage of 1.5 V.

When the handle (1) comprises an electronic device (17) connected to the thermoelectric generator (3), such as an electronic display (18), an electronic sensor (19) or a micro-fan (22), for example, such electricity production is sufficient to supply power to these various electronic devices (17).

Now, if the handle (1) is as described in the second embodiment, which is to say, when it is comprised of a radiator (12) with at least two fins (13) assembled vertically to obtain convection cooling, the operation is identical to that of the first embodiment of the handle (1), in which the heat sink (10) consists of two longitudinal fins (11).

Now, if the handle (1) is as described in the third embodiment, which is to say, when it consists of a latent heat sink comprised of a solid body (14) the melting point of which is between 50° C. and 70° C., it is this solid body (14) that is used as a cold source for the thermoelectric generator (3), and more specifically the latent phase change energy of this solid body (14) when it gradually melts. Then, this solid body (14), once melted, must, in turn, transfer this latent energy to the environment during a period when the product is not in use, which does not pose a problem, given the usage cycles of household products. The solid body (14), which in this instance is paraffin, will gradually resume its solid state once it is removed from the heat source.

If the handle (1) also comprises a heat diffuser (16), said heat diffuser makes it possible to dissipate the heat from one side of the handle (1) to the other.

In this third embodiment, the handle (1) may also comprise the crosswise through-holes (20) and/or the longitudinal through-holes mentioned above, in order to accelerate cooling.

This third embodiment operates precisely as follows: when the vessel (2) is heated, a flow is established through the thermoelectric generator (3), going from the heat source (the wall (27) of the vessel (2)) toward the cold source comprised of the solid body (14) and potentially the heat diffuser (16). At first, the temperature of the solid body (14) gradually rises from room temperature to its melting temperature (approximately 50° C.). Next, the solid body (14) will gradually melt, remaining at a temperature of approximately 50° C., thereby enabling the heat flow through the thermoelectric generator (3) to remain constant, and the same is true for the electricity production. During this time, the temperature of the handle (1) remains relatively cool as compared to a traditional handle. After a certain time, which depends on the amount of the solid body (14) and the power of the cooktop, the solid body (14) will be completed melted, and the temperature of the handle (1) will begin to rise until it reaches a thermal equilibrium with the surrounding air. In a standard case in which the vessel (2) is placed on a cooktop emitting 300 W, a handle (1) containing 40 cm$^3$ of a paraffin-type solid body (14), allows the thermoelectric generator (3) to function stably for 85 minutes, the maximum usable power being 20 mW at 2.5 V, while the exterior temperature of the handle (1) remains at 66° C.

At least the coupler (6), the thermoelectric generator (3) and the heat sink (10) form an electricity generating device that can be removed from the handle (1) for the purpose of cleaning or replacing defective parts. This power generating device may be attached to the interior of the handle (1) by clips, magnetization or even slides inside the handle (1).

It is understood that various modifications and/or improvements that are obvious to a person of ordinary skill in the art, may be made to the embodiments of the invention described in this description, while still remaining within the scope of the invention defined by the attached claims.

The invention claimed is:

1. A handle for a cooking vessel or lid that comprises at least one thermoelectric generator, wherein the handle comprises a releasable locking device and the thermoelectric generator comprises at least a first contact surface connected thermally to a metal thermal coupler, which comes into contact under pressure with a section of the cooking vessel or lid when the releasable locking device of the handle is in a locked position on the cooking vessel or lid, wherein the releasable locking device comprises a tightening part that squeezes the vessel or lid, wherein movement of the tightening part is initiated by one or more activation buttons, wherein the handle comprises a hollow body with a cavity having one or more intake holes and one or more output holes in communication with the cavity, wherein the one or more intake holes and the one or more output holes are configured for cooling the heat sink, and wherein the thermoelectric generator, a heat sink, and at least a portion of the releasable locking device are contained within the cavity.

2. The handle for a cooking vessel or lid according to claim 1, wherein the thermoelectric generator comprises a second contact surface, connected thermally to a connection part.

3. The handle for a cooking vessel or lid according to claim 2, wherein the heat sink is connected thermally to the connection part or directly to the second contact surface of the thermoelectric generator.

4. The handle for a cooking vessel or lid according to claim 3, wherein the heat sink is comprised of one or more fins that are shorter in length than the handle.

5. The handle for a cooking vessel or lid according to claim 4, wherein the fins are made of a heat-conductive material.

6. The handle for a cooking vessel or lid according to claim 4, wherein the fins are heat pipes.

7. The handle for a cooking vessel or lid according to claim 3, wherein the heat sink is comprised of a radiator comprising at least two fins assembled vertically and parallel to one another, to obtain convection cooling.

8. The handle for a cooking vessel or lid according to claim 3, wherein the heat sink is a latent heat sink comprised of a solid body with a melting point of between 50° C. and 70° C.

9. The handle for a cooking vessel or lid according to claim 8, wherein the handle comprises a heat diffuser.

10. The handle for a cooking vessel or lid according to claim 1, wherein the handle comprises an electronic device connected to the thermoelectric generator.

11. The handle for a cooking vessel or lid according to claim 10, wherein the electronic device may be an electronic display or an electronic sensor.

12. The handle for a cooking vessel or lid according to claim 1, wherein the handle comprises a micro-fan connected to the thermoelectric generator.

13. The handle for a cooking vessel or lid according to claim 1, wherein a total surface area of the one or more intake holes is larger than a total surface area of the one or more output holes.

* * * * *